United States Patent
DiCaprio

Patent No.: US 6,517,656 B1
Date of Patent: Feb. 11, 2003

(54) METHOD OF MAKING AN INTEGRATED CIRCUIT PACKAGE USING A BATCH STEP FOR CURING A DIE ATTACHMENT FILM AND A TOOL SYSTEM FOR PERFORMING THE METHOD

(75) Inventor: Vincent DiCaprio, Mesa, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/412,889

(22) Filed: Oct. 5, 1999

(51) Int. Cl.$^7$ ............................................... B32B 31/20
(52) U.S. Cl. .................... 156/235; 156/241; 156/275.5; 156/275.7
(58) Field of Search ................................ 156/230, 235, 156/237, 239, 241, 256, 273.3, 273.5, 275.5, 275.7, 358, 380.6, 539, 556, 558, 559, 560, 583.1, 273.7

(56) References Cited

U.S. PATENT DOCUMENTS

| | | | | |
|---|---|---|---|---|
| 3,859,723 A | * | 1/1975 | Hamer et al. | 29/626 |
| 3,982,979 A | * | 9/1976 | Hentz et al. | 156/73.6 |
| 4,607,779 A | * | 8/1986 | Burns | 228/106 |
| 5,049,434 A | * | 9/1991 | Wasulko | 428/202 |
| 5,110,388 A | * | 5/1992 | Komiyama et al. | 156/229 |
| 5,336,357 A | * | 8/1994 | Layher et al. | 156/391 |
| 5,972,735 A | * | 10/1999 | Dominic | 438/118 |

OTHER PUBLICATIONS

Mueller, Beat, "Swissline 9022 HSL: The New Benchmark for BOC and LOC–Package Assembly from 300mm Wafers," Alphasem Newsline, Jan. 2001, pp. 2–4 (downloaded from http://www.alphasem.com/news/news1.htm on Dec. 28, 2001.

"Recent Introduction of the Swissline 9002 CSP Boosts Cost Effectiveness of Chip Scale Packaging," Alphasem Newsline, Apr. 1998, pp. 1–3 (downloaded from http://www/alphasem.com/news/news1.htm on Dec. 28, 2001).

"Alphasem Introduces New Patent Pending Assembly Process for μBGA™ CSP Package," Alphasem Newsline, Jan. 1999, pp. 2–4 (downloaded from http://www.alphasem.com/news/news1.htm on Dec. 28, 2001).

* cited by examiner

Primary Examiner—Richard Crispino
Assistant Examiner—Cheryl N. Hawkins
(74) Attorney, Agent, or Firm—Skjerven Morrill LLP; James E. Parsons

(57) ABSTRACT

Methods of making packages for integrated circuit devices, and in particular for attaching a plurality of integrated circuit die to a substrate strip, are disclosed. The substrate includes a plurality of die mounting sites. A B-staged epoxy film is on each site. An exemplary method includes placing an integrated circuit die on the adhesive film of each site. After a plurality of integrated circuit die are individually placed on the substrate, the adhesive films of a plurality of sites are cured simultaneously in a batch process. The curing permanently attaches the die to the substrate. Subsequently, the die are wire bonded to their respective substrate sites and encapsulated. The encapsulated substrate is cut to form individual packages. A tool system for performing the die attachment process includes a head for picking up a die and placing the die on an adhesive film on the substrate strip, and a pair of opposing plates capable of pressing together and applying pressure and heat to a plurality of sites simultaneously so as to cure the adhesive film of the plurality of sites.

12 Claims, 2 Drawing Sheets

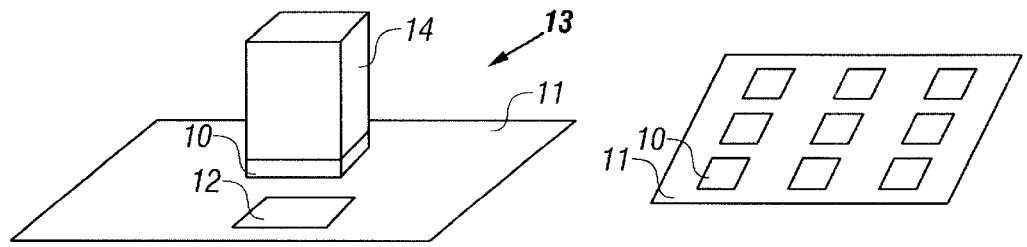
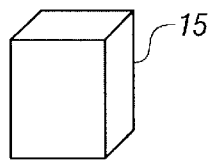
FIG. 1A
(Prior Art)
FIG. 1B
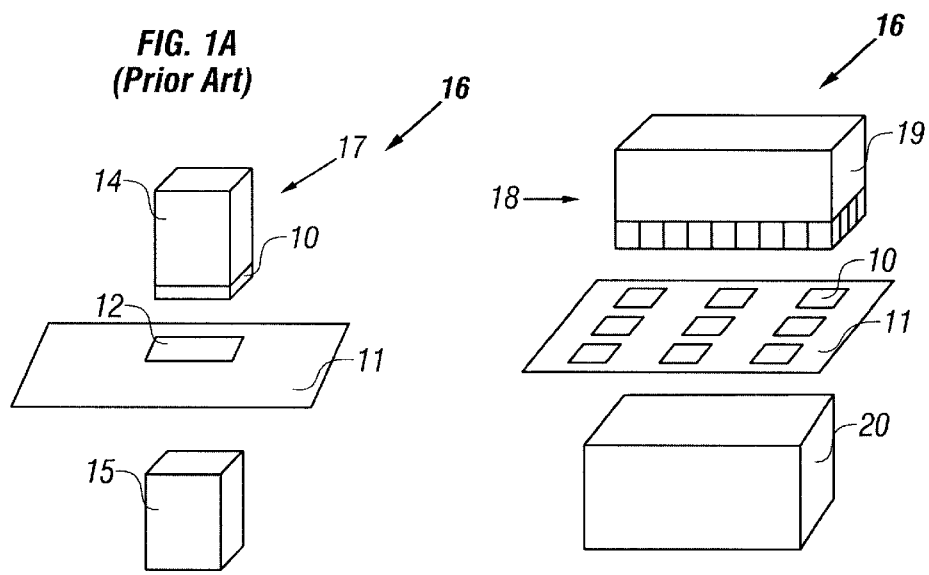
FIG. 3A
FIG. 3B
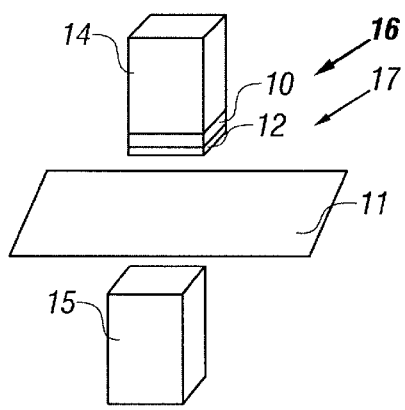
FIG. 4

METHOD OF MAKING AN INTEGRATED CIRCUIT PACKAGE USING A BATCH STEP FOR CURING A DIE ATTACHMENT FILM AND A TOOL SYSTEM FOR PERFORMING THE METHOD

FIELD OF THE INVENTION

The present invention relates to a method of making an integrated circuit device package, and in particular to a die attachment method using an adhesive film, and a tool system for performing the die attachment method.

BACKGROUND OF THE INVENTION

Integrated circuit packages typically include an integrated circuit die attached to a substrate. Bond wires or equivalent conductors are connected between the integrated circuit die and metallizations on the substrate. The metallizations are connected to other metal structures of the substrate, such as bonding pads or solder balls, for connecting the package to a printed circuit board.

Typically, a plurality of packages are built in parallel on substrate strip. The strip may be formed, for example, of a thin insulative film such as a polyimide film or an epoxy laminate film. Alternatively, the substrate strip may be an array of interconnected metal leadframes.

Conventional substrate strips include a plurality of die mounting sites. A die is attached to each mounting site of the substrate strip. Subsequently, the dies are each wire bonded to the metallizations of their respective mounting site, and the mounting sites are encapsulated. Finally, the substrate is cut with a saw or punch to form individual packages.

An increasingly common way to attach a die to a substrate strip is to use an adhesive film, such as a B-staged epoxy film. Another adhesive film available from the W. L. Gore Co. of Arizona is formed of a Teflon-like carrier material coated with adhesives. Such adhesive films characteristically require the application of pressure and heat for the adhesive to cure.

A conventional method of attaching a die 10 to a substrate strip 11 is shown in FIG. 1A. An initial step involves placing an adhesive film 12 on each die mounting site of substrate strip 11. Next, a conventional die attachment tool 13 is used to place a die 10 on the adhesive film 12 of each site of substrate strip 11. Pick-up head 14 of tool 13 picks up a die 10 from a cut wafer, indexes die 10, and places the die 10 on adhesive film 12. Head 14 and lower plate 15 of tool 13 press together and apply pressure and temperature to die 10, adhesive film 12, and substrate strip 11 for a selected period of time to cure adhesive film 12. Subsequently, head 14 detaches from the surface of die 10, picks up another die 10, and repeats the process. In particular, an erroneous reference to FIG. 1 is changed to FIG. 1A. No new matter is added.

Conventionally, the above-described placement and curing steps are done one die at a time until each package site of substrate strip 11 has a die 10 attached to it, as shown in FIG. 1B. Hence, the time to place and attach each die 10 to the substrate strip 11 is the sum of the placement time and the curing time. Typically, placing a die 10 on an adhesive film 12 of substrate strip 11 takes one second, and curing adhesive film 12 takes between 2 and 4 seconds, depending on the materials used and the area of the die. Accordingly, the attachment time for each die 10 is between 2 and 5 seconds. This time is then multiplied by the number of die 10 to determine the total processing time for each substrate strip 11. For a substrate strip 11 having 100 package sites, for example, the conventional die placement and attachment process takes at least 200 to 500 seconds to complete.

Artisans will appreciate that the cost of packaging an integrated circuit die depends, in part, on the efficiency of the assembly process. Accordingly, improvements in efficiency are highly desirable.

SUMMARY OF THE INVENTION

The present invention can provide orders of magnitude improvement in the efficiency of the die attachment process when using an adhesive film to attach a die to a substrate strip.

A method within the present invention includes placing an integrated circuit die onto an adhesive film at each package site of a substrate strip. The placement operation is continuous, that is, a die is placed on each of a plurality of die mounting sites until the substrate strip is fully populated. Subsequently, the adhesive films of a plurality of sites are simultaneously cured by applying heat and pressure to the plurality of sites. The method increases the throughput of the die attachment process because the curing step is a batch process, whereas in the prior art, the curing step was performed one die at a time immediately after placement of the particular die.

An embodiment of a tool system within the present invention for accomplishing the above process has two stations: (1) a die attach station; and (2) a batch curing station.

These and other objects, features and advantages of the present invention will be more readily apparent from the figures and the detailed description set forth below.

BRIEF DESCRIPTION OF DRAWINGS

FIG. 1A is a perspective view of a conventional die attachment process using a conventional die attachment tool 13.

FIG. 1B is a perspective view of a substrate strip 11 fully populated with integrated circuit dies 10.

FIGS. 3A and 3B are perspective views of steps in the attachment of integrated circuit dies 10 to a substrate strip 11 according to method 25 of FIG. 2 using a two-station die attach system 16.

FIG. 4 is a perspective view of a die 10 having an adhesive film 13 tacked to a lower surface of die 10 prior to the placement of die 10 on substrate strip 11.

DETAILED DESCRIPTION

Figure 2:
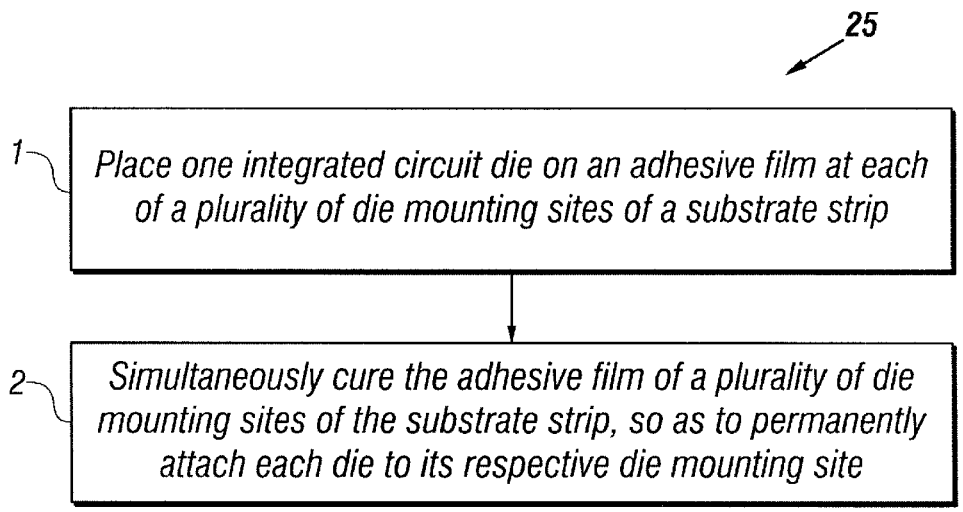
FIG. 2 is a flow chart of a method 25 of attaching an integrated circuit die 10 to each of a plurality of die mounting sites of a substrate strip 11.

FIG. 2 is a flow chart of a method 25 of attaching an integrated circuit die 10 to each of a plurality of die mounting sites of a substrate strip 11. FIGS. 3A and 3B provide perspective views of steps in the attachment of integrated circuit dies 10 to substrate strip 11 according to method 25 of FIG. 2.

Preliminary to method 25 of FIG. 2, a substrate strip 11 is provided that has a plurality of die mounting sites. Substrate strip 11 may be formed of any conventional substrate strip material used in packaging applications. For example, substrate strip 11 may be a polyimide film, an epoxy laminate film, or an array of metal leadframes. A double-sided adhesive film 12 is provided on the surface of substrate strip 11 at each mounting site, as shown in FIG. 3A. Alternatively, a contigious sheet of a double-sided adhesive film may cover all of substrate strip 11 or a plurality of die mounting sites of substrate strip 11.

Generally speaking, adhesive film 12 may be any double-sided adhesive film used in packaging applications that requires the application of pressure and/or heat for a selected amount of time to cure. Adhesive film 12 should have a modulus within a range of about 8 to 15 MPa at 50° C. The adhesive film may be a mono-layer or multi-layer material. As an example, adhesive film 12 may be HS-202 B-staged epoxy material from the Hitachi Chemical Company of Japan, having a thickness of 125 to 200 microns. Adhesive films 12 may be placed on substrate strip 11 in any manner.

Referring to FIG. 3A, Step 1 of method 25 of FIG. 2 places a die 10 on an adhesive film 12 at each of a plurality of die mounting sites of substrate strip 11. A die attachment system 16 within the present invention is used to perform method 25.

Die attachment system 16 of FIGS. 3A and 3B has two stations. First station 17 of die attachment system 16 is shown in FIG. 3A. First station 17 is essentially the same as conventional die attachment tool 13 of FIG. 1, and includes a pick up head 14 and lower plate 15. Head 14 picks up a die 10 from a wafer (not shown), indexes the die 10, and places the die 10 in the proper orientation on an adhesive film 12 at a die mounting site of substrate strip 11. Bottom plate 15 is juxtaposed with and supports an opposite surface of substrate 11 beneath adhesive film 12. Head 14 and bottom plate 15 of first station 17 press together, which brings die 10 into contact with adhesive film 12. Minimal pressure and minimal, if any, heating are applied by head 13 and bottom plate 14 to die 10, adhesive film 12, and substrate 11. The amount of pressure and temperature applied is merely enough to tack die 10 to adhesive film 12 so that die 10 will stay in place until the batch curing step of FIG. 3B. The pick up, indexing, and placement of individual die 10 is repeated in a continuous process, one die 10 at a time, until a die 10 is on the adhesive film 12 of each die mounting site of substrate strip 11.

Step 2 of method 25 of FIG. 2 simultaneously cures the adhesive film 12 of a plurality of die mounting sites of substrate strip 11 so as to permanently attach each die 10 to its respective die mounting site. Referring to FIG. 3B, a second station 18 of die attachment system 16 is used to perform Step 2 of method 25. Second station 18 includes a top plate 19 and a lower plate 20. Plates 19 and 20 press together and apply pressure and heat to dies 10, adhesive films 12, and substrate strip 11 for a selected period of time, e.g., 3 to 5 seconds. The amount of time varies, depending, for example, on the materials used and the area of the die.

In the embodiment of FIG. 3B, plates 19 and 20 are sized so that all three rows of three dies 10 are within the area plates 19 and 20. The pressure and heat applied by plates 19 and 20 simultaneously cure adhesive films 12 of each of the nine die mounting sites within plates 19 and 20, and thereby permanently attach the respective dies 10 to substrate strip 11.

The throughput of method 25 of FIG. 2 and system 16 of FIGS. 3A and 3B is significantly greater than the conventional method reflected in FIG. 1 and discussed above. For example, assume that a substrate strip 11 is used that has 100 die mounting sites, and that plates 19 and 20 of system 16 of FIG. 3B are sized so that all 100 sites fit within the area of plates 19 and 20. If it takes one second for first station 17 of system 16 to place each die 10 on the substrate strip, for a total of 100 seconds, and it takes second station 18 of system 19 five seconds to simultaneously cure the 100 adhesive films 12 of the substrate strip 11, then the total process time is 105 seconds. This represents a significant improvement on the 200 to 500 seconds of the prior art process described above.

In an alternative, albeit less efficient, method within the present invention, multiple curing steps are used to cure the adhesive films 12 of substrate strip 11 of FIG. 3B. Each curing step would cure the adhesive film 12 of at least two die mounting sites of substrate strip 11. For example, Step 2 of FIG. 2 could be performed separately for each of the three rows of die 10 on substrate strip 11 of FIG. 3B. The throughput advantage results from curing a plurality of adhesive films simultaneously, as opposed to the prior art process of one die at a time.

Dies 10 may be placed either circuit-side up or circuit-side down on adhesive film 12. Where die 10 is mounted circuit-side up, then upper plate 19 of second station 18 of system 16 of FIG. 3B may require padding to avoid damage to the die.

An alternative method of attaching dies 10 to substrate strip 11 involves a preliminary step of applying an adhesive film 12 to the lower surface of each of the integrated circuit dies 10 rather than to substrate strip 11. For example, a B-staged epoxy film can be tacked to the bottom of each die 10 (or to the wafer) prior to the pick up of the die 10 by head 13 of first station 17 of system 16 of FIG. 3A. FIG. 4 shows a die 10 having an adhesive film 12 tacked to a lower surface of die 10 prior to the placement die 10 on substrate strip 11. In other words, head 13 places both a die 10 and an adhesive film 12 on each die mounting site of substrate strip 11. Step 2 of method 25 of FIGS. 2 and 3B subsequently would be performed in the manner discussed above.

Artisans will appreciate that die attachment system 16 may be either a single two-station tool or a cluster of separate tools. As stated above, first station 17 of system 16 of FIG. 3A is essentially the same as conventional die attachment tool 13 of FIG. 1. Second station 18 of system 16 of FIG. 3B is constructable by attaching two appropriately-sized metal plates to an otherwise conventional die attachment tool, and providing one or both of plates 19 and 20 with a heat source. A conventional die attach tool control system can be used for controlling the pressure and heat applied by second station 18 and the time of Step 2 of method 25 of FIG. 2.

Figures 5A, 5B:
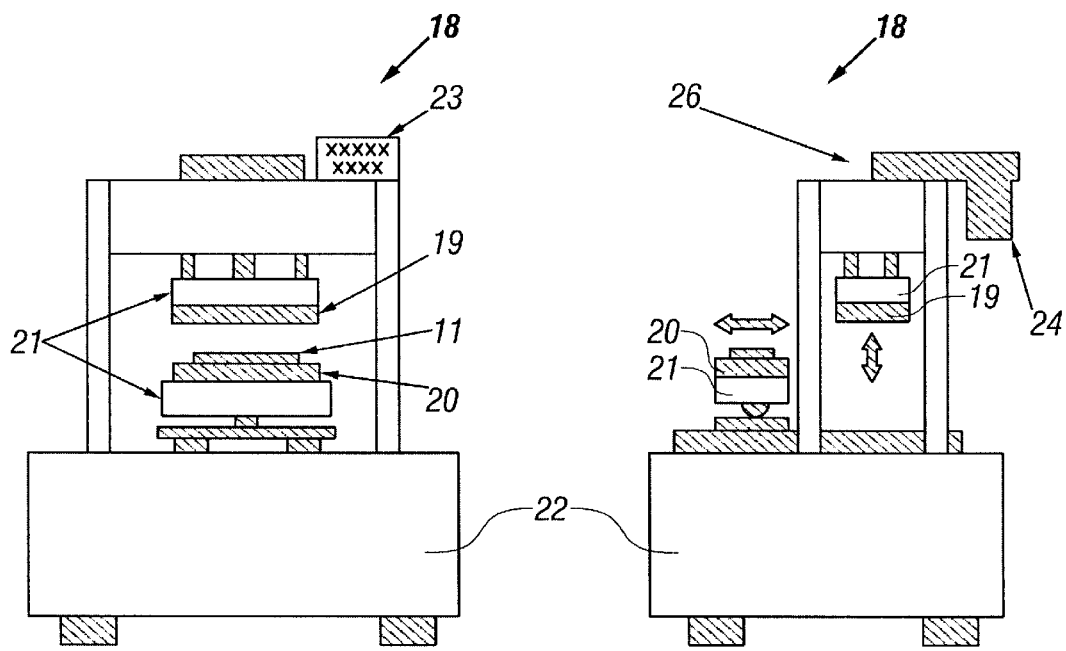
FIGS. 5A and 5B are frontal and side views of a tool 18 for curing a plurality of adhesive films on a substrate strip 11.

FIGS. 5A and 5B are frontal and side views, respectively, of a stand-alone second station 18 for performing the batch curing step of method 25 of FIG. 2. Second station 18 includes a vertically moveable upper plate 19 attached to a heating block 21. Horizontally moveable opposing lower plate 20 also is attached to a heating block 21. A substrate strip 11 is on lower plate 20. Second station 18 also includes a base 22, a display panel 23 for showing the process parameters, such as force and temperature, and a torque motor 24 and reduction gear box 26 for controlling the downward motion of upper plate 19. In use, a substrate strip 11 having an array of dies 10 is placed on lower plate 20 of second station 18. Lower plate 20 is then moved into position below upper plate 19, which moves downward and contacts dies 10. Pressure and heat are applied by the plates. After a selected amount of time, upper plate 19 is raised, lower plate 20 is moved into the unload position, and substrate strip 11 is moved to the next step in the production process.

The embodiments described herein are merely examples of the present invention. Artisans will appreciate that variations are possible within the scope of the claims.

What is claimed is:

1. A method of attaching a plurality of integrated circuit die to a substrate, said substrate including a plurality of die mounting sites, with each site having an adhesive film thereon, the method comprising.

placing an integrated circuit die on the adhesive film at each site sequentially; and subsequently curing the adhesive film of a plurality of sites simultaneously, wherein the substrate includes at least four sites, and curing the adhesive film of a plurality of sites simultaneously comprises multiple curing steps, wherein the adhesive film of at least two of the sites of the substrate are cured in each curing step.

2. The method of claim 1, wherein curing the adhesive film comprises applying beat and pressure.

3. The method of claim 1, wherein the adhesive film has a modulus in the range of about 8–15 MPa at 50° C.

4. The method of claim 2, wherein the substrate comprises a polyimide film.

5. The method of claim 2, wherein the substrate comprises an epoxy-laminate material.

6. The method of claim 2, wherein said substrate comprises a plurality of metal leadframes.

7. The method of claim 2, wherein the adhesive film comprises a B-staged epoxy.

8. The method of claim 2, wherein the adhesive film has a modulus in the range of about 8 to 15 MPa at 50° C.

9. The method of claim 1, wherein a single sheet of adhesive film covers a plurality of die mounting sites.

10. The method of claim 2, wherein a single sheet of adhesive film covers a plurality of die mounting sites.

11. The method of claim 1, wherein the step of caring comprises:

positioning the substrate and the plurality of placed integrated circuit die between a pair of opposed plates that cover a plurality of the sites simultaneously and pressing the plates together.

12. The method of claim 11, wherein at least one of the opposed plates is heated.

\* \* \* \* \*